(12) United States Patent
Ao et al.

(10) Patent No.: US 10,033,010 B2
(45) Date of Patent: Jul. 24, 2018

(54) OLED SUBSTRATE AND PREPARATION METHOD THEREOF, OLED PANEL, AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Ning Ao, Beijing (CN); Nini Bai, Beijing (CN); Chaobo Zhang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/507,044

(22) PCT Filed: Sep. 18, 2015

(86) PCT No.: PCT/CN2015/089920
§ 371 (c)(1),
(2) Date: Feb. 27, 2017

(87) PCT Pub. No.: WO2016/145810
PCT Pub. Date: Sep. 22, 2016

(65) Prior Publication Data
US 2017/0288165 A1    Oct. 5, 2017

(30) Foreign Application Priority Data
Mar. 18, 2015   (CN) .......................... 2015 1 0119584

(51) Int. Cl.
*H01L 51/52* (2006.01)
*H01L 51/00* (2006.01)
*H01L 27/32* (2006.01)

(52) U.S. Cl.
CPC ...... *H01L 51/5237* (2013.01); *H01L 27/3262* (2013.01); *H01L 51/0096* (2013.01); *H01L 2227/323* (2013.01)

(58) Field of Classification Search
CPC ............. H01L 51/5237; H01L 27/3262; H01L 51/0096
See application file for complete search history.

(56) References Cited

U.S. PATENT DOCUMENTS

| | | | |
|---|---|---|---|
| 9,634,074 B2* | 4/2017 | Son | ...................... H01L 27/3258 |
| 2003/0098647 A1* | 5/2003 | Silvernail | ........... H01L 51/5256 313/506 |

(Continued)

FOREIGN PATENT DOCUMENTS

| | | |
|---|---|---|
| CN | 1870287 A | 11/2006 |
| CN | 101009303 A | 8/2007 |

(Continued)

OTHER PUBLICATIONS

International Search Report and Written Opinion dated Nov. 11, 2015; PCT/CN2015/089920.

(Continued)

*Primary Examiner* — Nicholas Tobergte
(74) *Attorney, Agent, or Firm* — Ladas & Parry LLP (57) ABSTRACT

An OLED substrate (1) and a preparation method therefor, an OLED panel, and an OLED display apparatus. An inter-layer insulation layer (12) is formed in an edge area of the OLED substrate (1), and a concave is formed on the surface of the inter-layer insulation layer (12), so that the lateral tensile-resistance strength of the inter-layer insulation (Continued)

layer (12) and a package substrate can be increased, i.e. increasing a lateral tensile-resistance force between the OLED substrate (1) and the package substrate, thereby improving the stability of the OLED panel, ensuring the sealing effect of the OLED panel and improving the service life of the OLED panel.

18 Claims, 4 Drawing Sheets

(56) References Cited

U.S. PATENT DOCUMENTS

| | | | |
|---|---|---|---|
| 2004/0046494 A1* | 3/2004 | Lai | H01L 51/0097 |
| | | | 313/504 |
| 2004/0189196 A1 | 9/2004 | Cok | |
| 2005/0041193 A1* | 2/2005 | Lifka | H01L 51/5256 |
| | | | 349/153 |
| 2005/0046340 A1* | 3/2005 | Kohara | H01L 51/525 |
| | | | 313/504 |
| 2006/0267492 A1 | 11/2006 | Oh | |
| 2007/0128966 A1 | 6/2007 | Becken et al. | |
| 2007/0176548 A1 | 8/2007 | Kim et al. | |
| 2009/0283497 A1* | 11/2009 | Kondo | H05K 3/108 |
| | | | 216/13 |
| 2011/0186866 A1* | 8/2011 | Farquhar | H01L 25/048 |
| | | | 257/88 |
| 2013/0056735 A1 | 3/2013 | Heo et al. | |
| 2013/0134396 A1 | 5/2013 | Shimomura et al. | |
| 2014/0027742 A1 | 1/2014 | Sung | |
| 2014/0299862 A1 | 10/2014 | Lee et al. | |
| 2016/0293688 A1* | 10/2016 | Chen | H01L 27/3279 |

FOREIGN PATENT DOCUMENTS

| | | |
|---|---|---|
| CN | 101176182 A | 5/2008 |
| CN | 101740726 A | 6/2010 |
| CN | 102983150 A | 3/2013 |
| CN | 203339167 U | 12/2013 |
| CN | 103579534 A | 2/2014 |
| CN | 203883009 U | 10/2014 |
| CN | 104733504 A | 6/2015 |

OTHER PUBLICATIONS

First Chinese Office Action dated Mar. 16, 2017; Appln. No. 201510119584.9.
The Third Chinese Office Action dated Dec. 1, 2017; Appln. No. 201510119584.9.
The Second Chinese Office Action dated Jul. 31, 2017; Appln. No. 201510119584.9.

* cited by examiner

OLED SUBSTRATE AND PREPARATION METHOD THEREOF, OLED PANEL, AND DISPLAY APPARATUS

TECHNICAL FIELD

The present disclosure relates to a technical field of display, in particular to an OLED substrate and a preparation method thereof, an OLED panel and an OLED display device.

BACKGROUND

A package sealing effect of an OLED device directly affects a service life of the OLED device, and therefore, it is an important index for evaluating quality of the OLED device.

Figure 1:
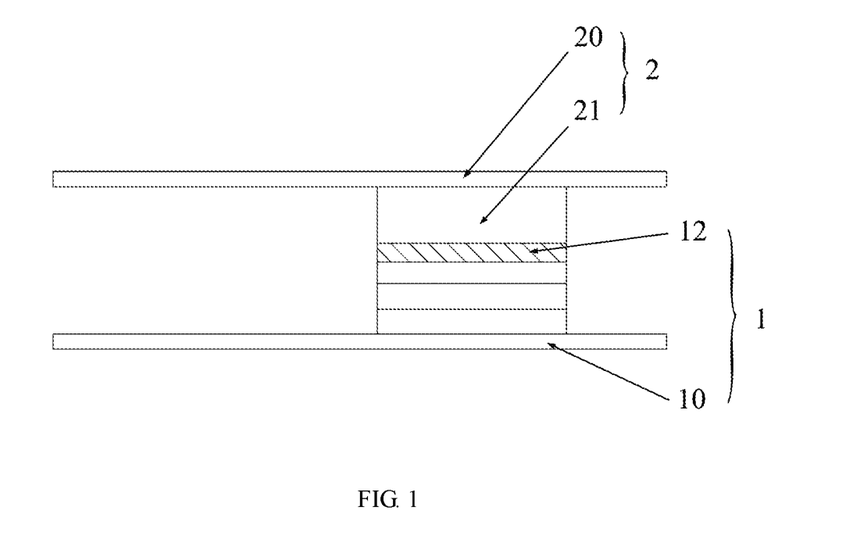
FIG. 1 is a schematic diagram of part of a structure of an conventional OLED panel.

FIG. 1 is a schematic diagram of part of a structure of a conventional OLED panel. As shown in FIG. 1, the OLED panel is formed by cell-assembling an OLED substrate 1 and a package substrate 2. The OLED substrate 1 comprises a substrate 10 and a light-emitting structure (including an anode layer, a cathode layer, and an organic function layer, etc.) prepared on the substrate 10. In an edge region of the OLED substrate 1, an insulating interlayer (ILD) 12 is further disposed, and the insulating interlayer 12 is located on an outermost side of the OLED substrate 1. The package substrate 2 comprises a glass layer 20 and glass cement 21 prepared in an edge region of the glass layer 20. When the OLED substrate 1 and the package substrate 2 are cell-assembled, the glass cement 21 and the insulating interlayer 12 are jointed, and the glass cement 21 is melted by laser irradiation, such that the OLED substrate 1 and the package substrate 2 are bonded together.

In practice, a transverse strength between the glass cement 21 and the insulating interlayer 12 is relatively small, such that it is hard for the OLED panel to bear a larger transverse pull force (i.e., a force in a direction parallel to the substrate 10 and the glass layer 20). When the transverse pull force is relatively large, relative movement emerges between the OLED substrate 1 and the package substrate 2 in the above OLED panel, as a result, a sealing effect of the OLED panel becomes poorer and the service life of the OLED panel is affected.

SUMMARY

In order to solve the above problems in the conventional technical solutions, embodiments of the present invention provide an OLED substrate and a preparation method therefor, an OLED panel and an OLED display apparatus. The lateral tensile-resistance strength of the insulating interlayer and a package substrate can be increased, i.e. increasing a lateral tensile-resistance force between the OLED substrate and the package substrate, thereby improving the stability of the OLED panel, ensuring the sealing effect of the OLED panel and improving the service life of the OLED panel.

Embodiments of the present invention provide an OLED substrate, wherein, an insulating interlayer is disposed in an edge region of the OLED substrate, at least one concave is provided on a surface of the insulating interlayer.

In one embodiment of the present invention, for example, the insulating interlayer comprises at least one layer of insulation material.

In one embodiment of the present invention, for example, a depth of the concave is not greater than 20% of a thickness of the insulating interlayer.

In one embodiment of the present invention, for example, at least two concaves are provided on a surface of the insulating interlayer and edges of adjacent concaves are connected to each other.

In one embodiment of the present invention, for example, at least two concaves is provided on a surface of the insulating interlayer and at least two concaves are uniformly distributed on the surface of the insulating interlayer.

In one embodiment of the present invention, for example, the insulating interlayer and an insulating layer over a gate electrode layer in a display region of the OLED substrate are disposed in a same layer.

In one embodiment of the present invention, for example, the edge region of the OLED substrate further comprises at least one of an active layer, a gate insulating layer and a gate electrode layer formed below the insulating interlayer.

In one embodiment of the present invention, for example, the active layer, the gate insulating layer and/or the gate electrode layer ill the edge region of the OLED substrate are respectively disposed in a same layer as an active layer, a gate insulating layer and/or a gate electrode layer in a thin film transistor circuit of the OLED substrate.

Embodiments of the present invention provide a method for preparing an OLED substrate, comprising: providing a substrate; forming at least one insulation material layer in an edge region of the substrate; and preparing a concave on a surface of the at least one insulation material layer to form an insulating interlayer.

In one embodiment of the present invention, for example, in the method, prior to the preparing the concave, the at least one insulation material layer and an insulating layer over a gate electrode layer in a display region of the OLED substrate are formed simultaneously.

In one embodiment of the present invention, for example, in the method, the concave is formed by a photoetching process.

In one embodiment of the present invention, for example, in the method, when an insulating layer over a gate electrode layer in a display region of the OLED substrate is formed, the insulating interlayer having the concave on the surface is formed by a semi-exposure process.

In one embodiment of the present invention, for example, in the method, a depth of the concave is not greater han 20% of a total thickness of the at least one insulation material layer.

In one embodiment of the present invention, for example, in the method, prior to the forming the at least one insulation material layer, the method further comprises: forming at least one of an active layer, a gate insulating layer and a gate electrode layer in the edge region of the substrate.

In one embodiment of the present invention, for example, in the method, an active layer, a gate insulating layer and/or a gate electrode layer in a thin film transistor circuit of the OLED substrate are formed simultaneously with the forming of the active layer, the gate insulating layer and/or the gate electrode layer in the edge region of the substrate.

Embodiments of the present invention provide an OLED panel, comprising the above described OLED substrate.

In the OLED substrate and the preparation method therefor, the OLED panel and the OLED display apparatus provided by the embodiments of the present invention, concaves are provided on the surface of the insulating interlayer; when the OLED substrate and the package substrate are cell-assembled to be packaged, the glass cement of the package substrate can be embedded into the insulating interlayer through the concaves, such that the glass cement and the insulating interlayer are combined together; in this way, a lateral tensile-resistance strength of the inter-layer insulating layer and a package substrate can be increased, i.e. increasing a lateral tensile-resistance force between the OLED substrate and the package substrate, thereby improving the stability of the OLED panel, ensuring the sealing effect of the OLED panel and improving the service life of the OLED panel.

BRIEF DESCRIPTION OF THE DRAWINGS

The drawings constituting part of the specification are used to further explain the present disclosure, and are used for explaining the present disclosure together with specific embodiments below rather than limiting the present disclosure.

DETAILED DESCRIPTION

The technical solutions of the embodiment will be described in a clearly and fully understandable way in connection with the drawings related to the embodiments of the disclosure. It is understandable that the described embodiments are just exemplary embodiments for explaining the present invention. The present invention is not limited by the above described embodiments.

Figure 2:
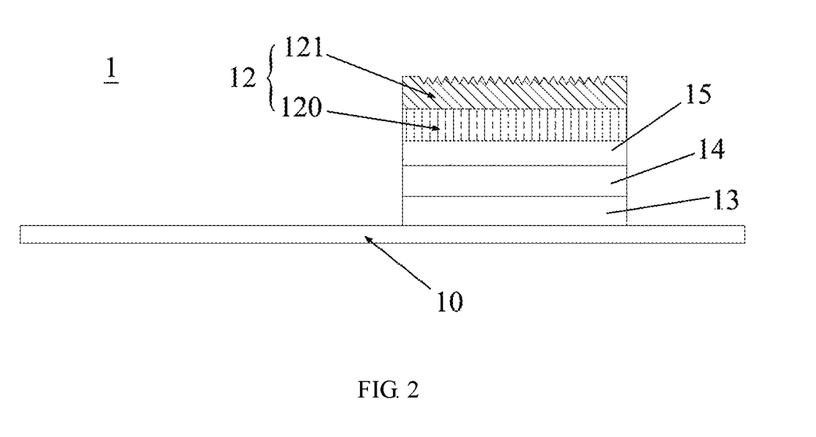
FIG. 2 is a schematic diagram of part of a structure of an OLED substrate according to an embodiment of the present disclosure.

An embodiment of the present disclosure provides an OLED substrate, and FIG. 2 is a schematic diagram of part of structure of an OLED substrate provided by an embodiment of the present disclosure. In the present embodiment, as shown in FIG. 2, the OLED substrate comprises a substrate 10 and an insulating interlayer 12 disposed in an edge region of the OLED substrate 1, and at least one concave is provided on a surface of the insulating interlayer 12.

Figure 3:
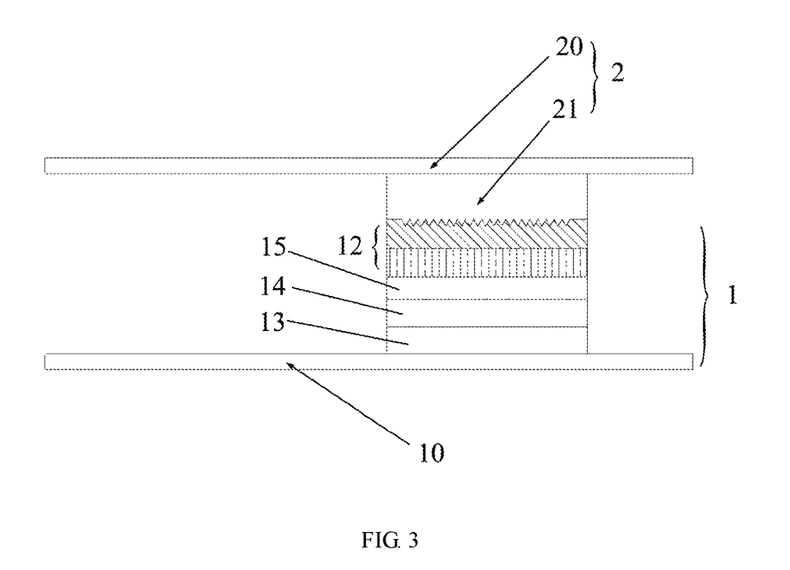
FIG. 3 is a schematic diagram of part of a structure after an OLED substrate and a package substrate are cell-assembled according to an embodiment of the present disclosure.

FIG. 3 is a schematic diagram of part of an OLED structure after the substrate 1 and the package substrate 2 are cell-assembled according to an embodiment of the present disclosure. As shown in FIG. 3, the package substrate 2 comprises a glass layer 20 and glass cement 21 disposed in the edge region of the package substrate 2.

With reference to FIG. 2 and FIG. 3, concaves are provided on the surface of the insulating interlayer 12; when the OLED substrate 1 and the package substrate 2 are cell-assembled to be packaged, the glass cement 21 of the package substrate 2 can be embedded into the insulating interlayer 12 through the concaves, such that the glass cement 21 and the insulating interlayer 12 are combined together; in this way, a lateral tensile-resistance strength of the inter-layer insulating layer 12 and a package substrate can be increased, i.e. increasing a lateral tensile-resistance force between the OLED substrate 1 and the package substrate 2, thereby improving the stability of the OLED panel, ensuring the sealing effect of the OLED panel and improving the service life of the OLED panel.

In the present embodiment, the insulating interlayer 12 comprises at least one insulation material layer. For example, as shown in FIG. 2, the insulating interlayer 12 comprises two insulation material layers 120 and 121, the insulation material layer 120 is made of $SiO_x$ and the insulation material layer 121 is made of $SiN_x$.

In the present embodiment, for example, a depth of the concave is not greater than 20% of a thickness of the insulating interlayer. In this way, the concave has a certain depth, such that the lateral tensile-resistance strength between the insulating interlayer 12 and the glass cement 21 is ensured, meanwhile it is ensured that the insulating interlayer 12 has enough thickness at the positions corresponding to the concaves, and a good insulation effect is realized.

In the present embodiment, a plurality of the concaves can be provided. On this basis, the edges of the adjacent concaves can be connected mutually, that is, the plurality of concaves form a "sawtooth" shape; in this way, the lateral tensile-resistance strength between the insulating interlayer 12 and the glass cement 21 is increased to the greatest extent, and the stability of the OLED panel is improved.

In addition, in a case that the number of the concaves is plural, the plurality of concaves can be uniformly distributed on the surface of the insulating interlayer 12; due to such setting, each region of the insulating interlayer 12 and the glass cement 21 can bear a friction force uniformly.

The insulating interlayer 12 and an insulating layer over a gate electrode layer in a display region are disposed in a same layer, and the edge region of the OLED substrate 1 further comprises at least one of an active layer 13, a gate insulating layer 14 and a gate electrode layer 15 formed below the insulating interlayer 12.

It is appreciated that in the present disclosure, "disposed in a same layer" means "formed in a same patterning process", that is, formed in one patterning process with a same mask.

A thin film transistor circuit is manufactured in the display region of the OLED substrate 1, that is, structures such as the active layer, the gate insulating layer, the gate electrode layer, the insulating interlayer, an S/D layer and the like are formed in sequence. In the present embodiment, the active layer 13, the gate insulating layer 14 and/or the gate electrode layer 15 in the edge region of the OLED substrate 1 and the active layer, the gate insulating layer and/or the gate electrode layer in the thin film transistor circuit of the OLED substrate 1 are formed at the same time; that is, when the active layer, the gate insulating layer and/or the gate electrode layer in the circuit of the OLED substrate 1 are formed, structures of the active layer 13, the gate insulating layer 14 and/or the gate electrode 15 are reserved in the edge region of the OLED substrate 1 instead of being etched; in this way, the insulating interlayer 12 in the edge region of the OLED substrate 1 is heightened, that is, the insulating interlayer 12 is prepared at a higher position on the surface of the substrate 10 to be conveniently combined with the glass cement 21. For example, in one embodiment, as shown in FIG. 2, the active layer 13, the gate electrode layer 14 and the gate electrode layer 15 are disposed below the insulating interlayer 12.

In conclusion, in the OLED substrate 1 provided by the embodiments of the present disclosure, the concaves are provided on the surface of the insulating interlayer 12; when the OLED substrate 1 and the package substrate 2 are cell-assembled to be packaged, the insulating interlayer 12 and the glass cement 21 of the package substrate 2 can be combined together through the concaves; in this way, a lateral tensile-resistance strength of the inter-layer insulating layer 12 and a package substrate can be increased, i.e. increasing a lateral tensile-resistance force between the OLED substrate 1 and the package substrate 2, thereby improving the stability of the OLED panel, ensuring the sealing effect of the OLED panel and improving the service life of the OLED panel.

Figure 4:
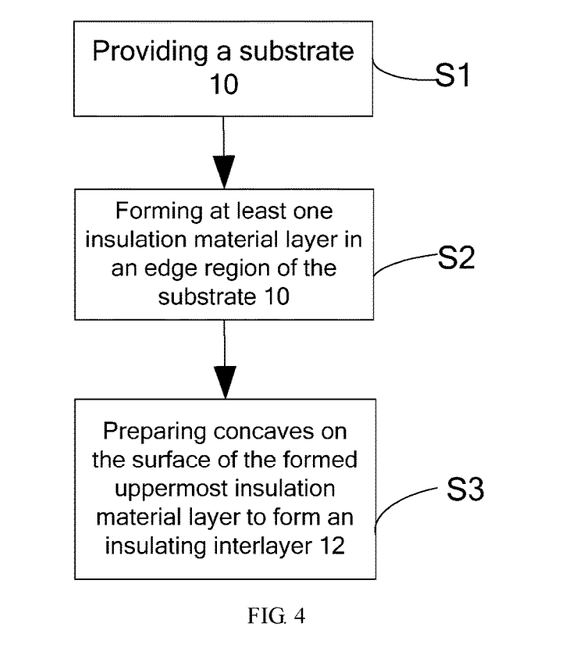
FIG. 4 is a flow chart showing the preparing process of an insulating interlayer according to an embodiment of the present disclosure.

Another embodiment of the present disclosure provides a method for preparing an OLED substrate, and FIG. 4 is a flow chart of a method for preparing an OLED substrate provided by an embodiment of the present disclosure. As shown in FIG. 4, the method for preparing an OLED substrate comprises the following steps S1-S3.

In step S1, providing a substrate 10.

Figure 5:
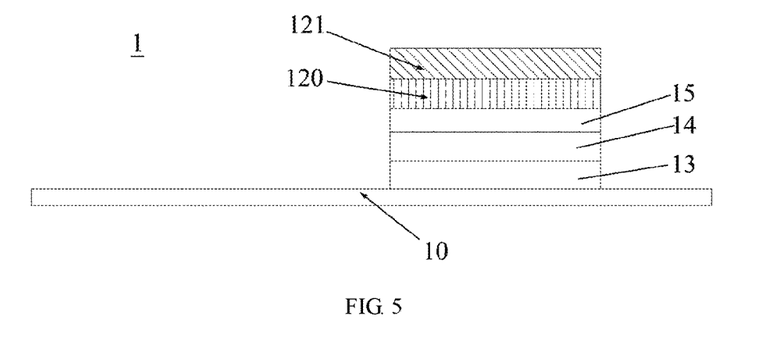
FIG. 5 is a schematic diagram of an edge structure of an OLED substrate after an insulation material layer is prepared according to an embodiment of the present disclosure.

In step S2, forming at least one insulation material layer in an edge region of the substrate 10, as shown in FIG. 5.

For example, the material of the insulation material layer can be $SiO_x$, $SiN_x$ or other insulation materials. For example, as shown in FIG. 5, $SiO_X$ and $SiN_x$ are deposited in sequence, such that the two insulation material layers 120 and 121, that is, a $SiO_x$ layer and a $SiN_x$ layer are obtained on the substrate 1.

In addition, while the insulating layer over the gate electrode layer in a display region of the OLED substrate is formed, at least one insulation material layer is formed in the edge region of the substrate 10, that is, the insulating layer over the gate electrode layer in the display region of the OLED substrate and the at least one insulation material layer can be formed in a same patterning process.

In step S3, preparing concaves on the surface of the formed uppermost insulation material layer to form an insulating interlayer 12, as shown in FIG. 2. For example, after the insulation material layers 120 and 121 as shown in FIG. 5 are deposited, the concaves are prepared on the surface of the $SiN_x$ layer 121.

The concaves can be prepared through a photoetching process. For example, the photoetching process for preparing the concaves may comprise the following steps S30-S33.

Figure 6:
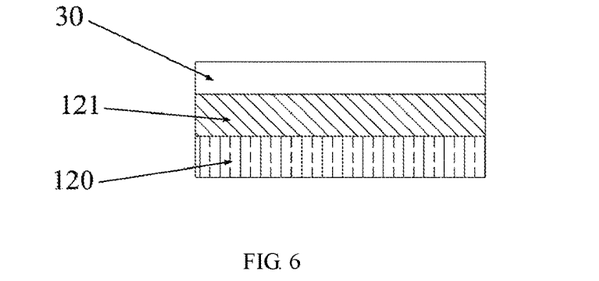
FIG. 6 is a schematic diagram of an edge structure of an OLED substrate after the insulation material layer is coated with photoresist according to an embodiment of the present disclosure.

In step S30, coating a surface of the uppermost insulation material layer with photoresist 30, as shown in FIG. 6. The photoresist 30 may be positive or negative photoresist.

Figure 7:
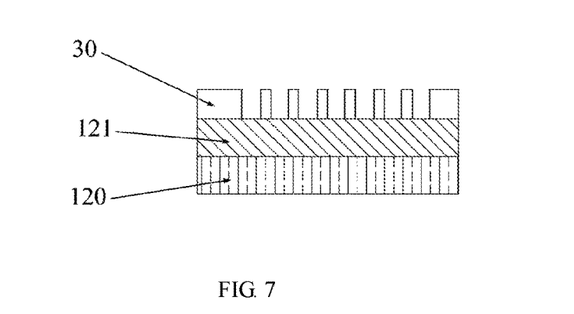
FIG. 7 is a schematic diagram of an edge structure of an OLED substrate after exposing and developing according to an embodiment of the present disclosure.

In step S31, exposing and developing the photoresist 30 as shown in FIG. 7.

Figure 8:
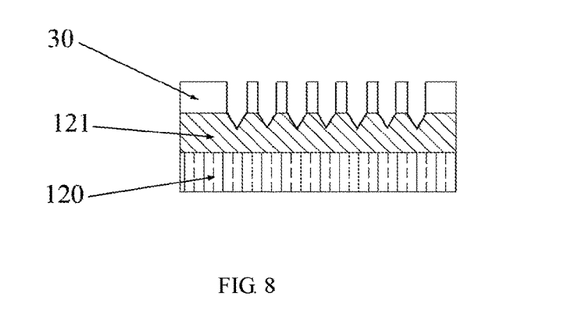
FIG. 8 is a schematic diagram of an edge structure of an OLED substrate after etching according to an embodiment of the present disclosure.

In step S32, forming the concaves on the surface of the uppermost insulation material layer, as shown in FIG. 8.

Figure 9:
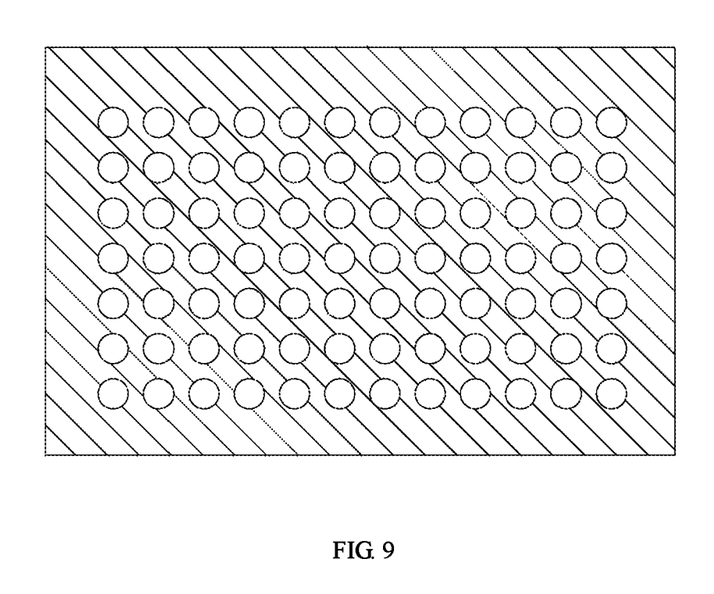
FIG. 9 is a schematic diagram of a mask used when the structure of an insulating interlayer is manufactured according to an embodiment of the present disclosure.

For example, after each part of the photoresist 30 is removed, the exposed regions of the insulation material layers are all round, and round concaves can be obtained by the etching process in step S32. For example, in order to obtain the round exposed regions of the insulation material layers, in a case that the photoresist layer 30 is positive photoresist, a mask used for exposing the photoresist 30 is provided to have a round transparent region, as shown in FIG. 9; and in a case that the photoresist 30 is negative photoresist, a mask used by exposing the photoresist 30 is provided to have a round opaque region.

In step S33, stripping off residual photoresist 30 on the surface of the insulation material layer, and obtaining the insulating interlayer 12 as shown in FIG. 2.

The insulating interlayer 12 prepared according to the above described processes has the concaves on the surface. When the OLED substrate and the package substrate 2 are cell-assembled for packaging, the glass cement 21 of the package substrate 2 can be embedded into the insulating interlayer 12 through the concaves, such that the glass cement 21 and the insulating interlayer 12 can be combined together; in this way, a lateral tensile-resistance strength of the inter-layer insulating layer 12 and a package substrate can be increased, i.e. increasing a lateral tensile-resistance force between the OLED substrate 1 and the package substrate 2, thereby improving the stability of the OLED panel, ensuring the sealing effect of the OLED panel and improving the service life of the OLED panel.

In the present embodiment, for example, an etching depth in the etching process is not greater than 20% of a total thickness of the insulation material layer. For example, in the example as shown in FIG. 2, the depth of the concaves is not greater than 20% of a sum of thicknesses of the $SiO_x$ layer 120 and the $SiN_x$ layer 121. Due to such setting, the concaves can have certain depth, such that the lateral tensile-resistance strength between the insulating interlayer 12 and the glass cement 21 is ensured, meanwhile it is ensured that the insulating interlayer 12 has enough thickness at the positions corresponding to the concaves, and a good insulation effect is realized.

In the present embodiment, for example, a plurality of concaves are formed on the surface of the insulation material layer, and the edges of the adjacent concaves can be connected mutually, that is, the multiple concaves form a "sawtooth" shape; in this way, the lateral tensile-resistance strength between the insulating interlayer 12 and the glass cement 21 is increased to the greatest extent, and the stability of the OLED panel is improved.

Meanwhile, in a case that a plurality of concaves are formed on the surface of the insulation material layer, the plurality of concaves can be uniformly distributed on the insulation material layer, and due to such setting, each region of the insulating interlayer 12 and the glass cement 21 can bear a friction force uniformly.

For example, at least one of an active layer 13, a gate insulating layer 14 and a gate electrode 15 is formed below the insulating interlayer 12. The active layer 13, the gate insulating layer 14 and/or the gate electrode layer 15 and the active layer, the gate insulating layer and/or the gate electrode layer in the circuit of the OLED substrate are formed at the same time; that is, when the active layer, the gate insulating layer and/or the gate electrode layer in the circuit of the OLED substrate 1 are formed, structures of the active layer, 13, the gate insulating layer 14 and/or the gate electrode layer 15 are reserved in the edge region of the OLED substrate instead of being etched; in this way, the insulating interlayer 12 is heightened, that is, the insulating interlayer 12 is prepared at a higher position of the substrate 20, to be conveniently combined with the glass cement 21.

It is noted that in the present embodiment, when an insulating layer above the gate electrode layer in the display region is formed, the insulating interlayer 12 having the concaves may be formed through a semi-exposure process at the same time. Compared with the above described method, process configuration can be reduced in this way, such that production time is reduced and production efficiency is improved.

Figure 10:
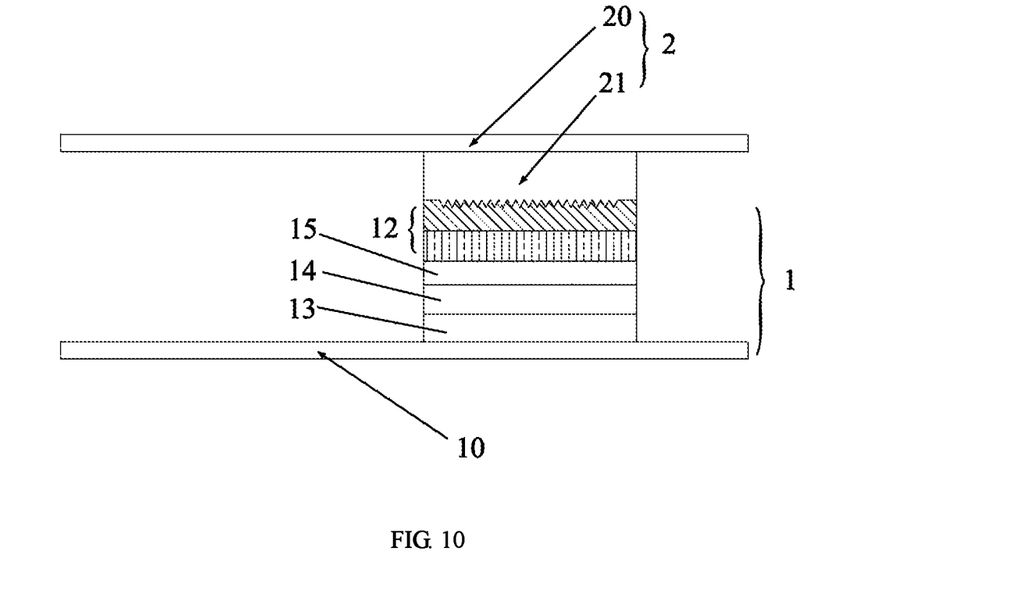
FIG. 10 is a schematic diagram of part of a structure of an OLED panel according to an embodiment of the present disclosure.

Another embodiment of the present disclosure provides an OLED panel, and FIG. 10 is a schematic diagram of part of a structure of an OLED panel provided by an embodiment of the present disclosure. In the present embodiment, as shown in FIG. 10, the OLED panel comprises the OLED substrate 1 and the package substrate 2 provided by the embodiments of the present disclosure, the OLED substrate 1 contacts the package substrate 2 through a surface of the insulating interlayer 12, the package substrate 2 contacts the OLED substrate 1 through a surface of the glass cement 21, the insulating interlayer 12 and the glass cement 21 are fused together, and the surface of the insulating interlayer 12 has concaves.

In the OLED panel provided by the embodiment of the present disclosure, the surface of the insulating interlayer 12 has concaves, such that the OLED substrate 1 and the glass cement 21 of the package substrate 2 are combined together through the concaves; in this way, a lateral tensile-resistance strength of the inter-layer insulating layer 12 and a package substrate can be increased, i.e. increasing a lateral tensile-resistance force between the OLED substrate 1 and the package substrate 2, thereby improving the stability of the OLED panel, ensuring the sealing effect of the OLED panel and improving the service life of the OLED panel.

Another embodiment of the present disclosure provides an OLED display device. In the present embodiment, the OLED display device comprises the OLED panel provided by the embodiment of the present disclosure.

In the OLED display device provided by the embodiment of the present disclosure, the transverse tensile resistance of the OLED panel is increased, such that the OLED panel of the OLED display device has better stability and sealing effect, and the service life of the OLED display device is prolonged.

It is noted that in the drawings, although the active layer 13, the gate insulating layer 14 and/or the gate electrode layer 15 are disposed or formed on the substrate 10 below the insulating interlayer 12 in sequence, but the present disclosure is not limited thereto. In other embodiments of the present disclosure, below the insulating interlayer 12, the gate electrode layer 15, the gate insulating layer 14 and/or the active layer 13 can be disposed or formed below the insulating interlayer 12 in sequence as long as the electrode layer 15, the gate insulating layer 14 and/or the active layer 13 heighten the insulating layer 1. In addition, the terms "and/or" refer to any of listed respective elements.

It is understandable that the above described embodiments are just exemplary embodiments for explaining the principle of the present invention. The present invention are not limited by the above described embodiments. Based on the described embodiments herein, those skilled in the art can obtain other embodiment(s), without any inventive work, which should be within the scope of the disclosure.

The present application claims the priority of the Chinese Patent Application No. 201510119584.9 filed on Mar. 18, 2015, which is incorporated herein by reference as part of the disclosure of the present application.

The invention claimed is:

1. An organic light emitting diode (OLED) substrate, wherein, an insulating interlayer is disposed in an edge region of the OLED substrate, and at least one concave is provided on a surface of the insulating interlayer;
   wherein the insulating interlayer and an insulating layer over a gate electrode layer in a display region of the OLED substrate are disposed in a same layer.

2. The OLED substrate according to claim 1, wherein the insulating interlayer comprises at least one layer of insulation material.

3. The OLED substrate according to claim 1, wherein a depth of the concave is not greater than 20% of a thickness of the insulating interlayer.

4. The OLED substrate according to claim 1, wherein at least two concaves are provided on a surface of the insulating interlayer and edges of adjacent concaves are connected to each other.

5. The OLED substrate according to claim 1, wherein at least two concaves are provided on a surface of the insulating interlayer and at least two concaves are uniformly distributed on the surface of the insulating interlayer.

6. The OLED substrate according to claim 1, wherein the edge region of the OLED substrate further comprises at least one of an active layer, a gate insulating layer and a gate electrode layer formed below the insulating interlayer.

7. The OLED substrate according to claim 6, wherein the active layer, the gate insulating layer and/or the gate electrode layer in the edge region of the OLED substrate are respectively disposed in a same layer as an active layer, a gate insulating layer and/or a gate electrode layer in a thin film transistor circuit of the OLED substrate.

8. A method for preparing an organic light-emitting diode (OLED) substrate, comprising:
   providing a substrate;
   forming at least one insulation material layer in an edge region of the substrate; and
   preparing a concave on a surface of the at least one insulation material layer to form an insulating interlayer;
   wherein prior to the preparing the concave, the at least one insulation material layer and an insulating layer over a gate electrode layer in a display region of the OLED substrate are formed simultaneously.

9. The method according to claim 8, wherein the concave is formed by a photoetching process.

10. The method according to claim 8, wherein when an insulating layer over a gate electrode layer in a display region of the OLED substrate is formed, the insulating interlayer having the concave on the surface is formed by a semi-exposure process.

11. The method according to claim 8, wherein a depth of the concave is not greater than 20% of a total thickness of the at least one insulation material layer.

12. The method according to claim 8, wherein prior to the forming the at least one insulation material layer, the method further comprises:
   forming at least one of an active layer, a gate insulating layer and a gate electrode layer in the edge region of the substrate.

13. The method according to claim 12, wherein an active layer, a gate insulating layer and/or a gate electrode layer in a thin film transistor circuit of the OLED substrate are formed simultaneously with forming of the active layer, the gate insulating layer and/or the gate electrode layer in the edge region of the substrate.

14. An organic light-emitting diode (OLED) panel, comprising the OLED substrate according to claim 1.

15. The OLED panel according to claim 14, further comprising a package substrate, wherein glass cement is formed in an edge region of the package substrate, wherein the surface of the insulating interlayer having the concave are bonded together with the glass cement.

16. An organic light-emitting diode (OLED) display device, comprising the OLED panel according to claim 14.

17. An organic light-emitting diode (OLED) panel, comprising the OLED substrate according to claim 2.

18. An organic light-emitting diode (OLED) panel, comprising the OLED substrate according to claim 3.

* * * * *